(12) United States Patent
Suzuki et al.

(10) Patent No.: US 8,513,777 B2
(45) Date of Patent: Aug. 20, 2013

(54) METHOD AND APPARATUS FOR GENERATING RETICLE DATA

(75) Inventors: Kenji Suzuki, Kasugai (JP); Yukisada Horie, Kasugai (JP); Katsuhito Kojima, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 137 days.

(21) Appl. No.: 12/485,396

(22) Filed: Jun. 16, 2009

(65) Prior Publication Data

US 2009/0321891 A1    Dec. 31, 2009

(30) Foreign Application Priority Data

Jun. 27, 2008   (JP) ................................. 2008-168725

(51) Int. Cl.
*H01L 23/544* (2006.01)

(52) U.S. Cl.
USPC ........... 257/620; 438/463; 438/460; 438/624; 438/5; 438/401; 257/797; 257/786; 257/752; 257/758; 257/776; 257/659

(58) Field of Classification Search
USPC ................ 257/797, 620, 786, 752, 758, 776; 438/463, 460, 624, 5, 401
See application file for complete search history.

(56) References Cited

U.S. PATENT DOCUMENTS

| | | | | |
|---|---|---|---|---|
| 5,138,419 A * | 8/1992 | Tatematsu | ...................... | 257/723 |
| 6,433,438 B2 * | 8/2002 | Koubuchi et al. | ............. | 257/776 |
| 6,518,633 B2 * | 2/2003 | Mori et al. | ...................... | 257/396 |
| 6,593,226 B2 * | 7/2003 | Travis et al. | ................... | 438/626 |
| 6,603,162 B1 * | 8/2003 | Uchiyama et al. | ............ | 257/296 |
| 6,841,880 B2 * | 1/2005 | Matsumoto et al. | .......... | 257/773 |
| 6,879,025 B2 * | 4/2005 | Sasaki et al. | ................... | 257/620 |
| 6,893,943 B2 * | 5/2005 | Ohsumi et al. | ................ | 438/462 |
| 6,989,582 B2 * | 1/2006 | Sniegowski et al. | .......... | 257/620 |
| 7,009,233 B2 * | 3/2006 | Uchiyama et al. | ............. | 257/296 |
| 7,015,118 B2 * | 3/2006 | Wakayama | ..................... | 438/460 |
| 7,057,261 B2 * | 6/2006 | Jensen et al. | ................... | 257/620 |
| 7,062,747 B2 * | 6/2006 | Horie et al. | ...................... | 716/55 |
| 7,105,925 B2 * | 9/2006 | Boardman et al. | ............. | 257/752 |
| 7,339,256 B2 * | 3/2008 | Nakamura et al. | ............. | 257/659 |
| 7,545,024 B2 * | 6/2009 | Kida | ............................. | 257/620 |
| 7,554,202 B2 * | 6/2009 | Koubuchi et al. | .............. | 257/776 |
| 7,554,211 B2 * | 6/2009 | Kida et al. | ...................... | 257/797 |
| 7,618,878 B2 * | 11/2009 | Nakamura et al. | ............. | 438/463 |
| 7,626,267 B2 * | 12/2009 | Koubuchi et al. | .............. | 257/758 |
| 7,649,268 B2 * | 1/2010 | Kuo et al. | ....................... | 257/786 |
| 7,678,684 B2 * | 3/2010 | Koubuchi et al. | .............. | 438/624 |
| 7,692,319 B2 * | 4/2010 | Sogawa | ........................ | 257/797 |

(Continued)

FOREIGN PATENT DOCUMENTS

| | | |
|---|---|---|
| JP | 56-12644 A | 2/1981 |
| JP | 62-54921 A | 3/1987 |

(Continued)

*Primary Examiner* — Fernando L Toledo
*Assistant Examiner* — Mohammed Shamsuzzaman
(74) *Attorney, Agent, or Firm* — Fujitsu Patent Center (57) ABSTRACT

A method for generating reticle data for forming a reticle. The method includes recognizing a non-layout region free from main chips in a process pattern, dividing the non-layout region into a plurality of rectangular non-layout regions, generating scribe data using the plurality of divided rectangular non-layout region as a plurality of dummy chips, and generating a dummy pattern for each of the dummy chips.

8 Claims, 12 Drawing Sheets

(56) References Cited

U.S. PATENT DOCUMENTS

| | | | |
|---|---|---|---|
| 7,696,607 B2 * | 4/2010 | Sano et al. | 257/620 |
| 7,723,826 B2 * | 5/2010 | Miyata et al. | 257/620 |
| 7,755,207 B2 * | 7/2010 | Sogawa et al. | 257/797 |
| 7,844,934 B2 | 11/2010 | Ono et al. | |
| 7,968,259 B2 * | 6/2011 | Hoshino et al. | 430/30 |
| 2001/0003054 A1 * | 6/2001 | Sumitani | 438/401 |
| 2001/0017394 A1 * | 8/2001 | Mori et al. | 257/510 |
| 2003/0183860 A1 * | 10/2003 | Uchiyama et al. | 257/296 |
| 2007/0241766 A1 * | 10/2007 | Kamitai et al. | 324/763 |
| 2008/0096113 A1 * | 4/2008 | Naoe | 430/5 |
| 2009/0162760 A1 * | 6/2009 | Hoshino et al. | 430/30 |
| 2009/0319971 A1 * | 12/2009 | Sakakidani | 716/5 |
| 2011/0156219 A1 * | 6/2011 | Kawashima et al. | 257/620 |

FOREIGN PATENT DOCUMENTS

| | | |
|---|---|---|
| JP | 63-236045 A | 9/1988 |
| JP | 2000-147742 A | 5/2000 |
| JP | 2004-022631 | 1/2004 |
| JP | 2004-069829 | 3/2004 |
| JP | 2004-294664 | 10/2004 |
| JP | 2006-189674 | 7/2006 |
| JP | 2007-27290 | 2/2007 |
| JP | 2007-287770 | 11/2007 |

* cited by examiner

$S = shotX \cdot shotY$

METHOD AND APPARATUS FOR GENERATING RETICLE DATA

CROSS-REFERENCE TO RELATED APPLICATIONS

This application is based upon and claims the benefit of priority from prior Japanese Patent Application No. 2008-168725, filed on Jun. 27, 2008, the entire contents of which are incorporated herein by reference.

FIELD

The present disclosure relates to a method and an apparatus for generating data for forming a reticle.

BACKGROUND

The costs for producing reticles have increased due to miniaturization of semiconductor integrated circuit device over these recent years. Therefore, a multi-chip reticle adapted to expose different types of chips with the similar reticle has been proposed. For instance, a multi-die reticle adapted to expose chips of different types and sizes with the similar reticle has been proposed.

Figure 16:
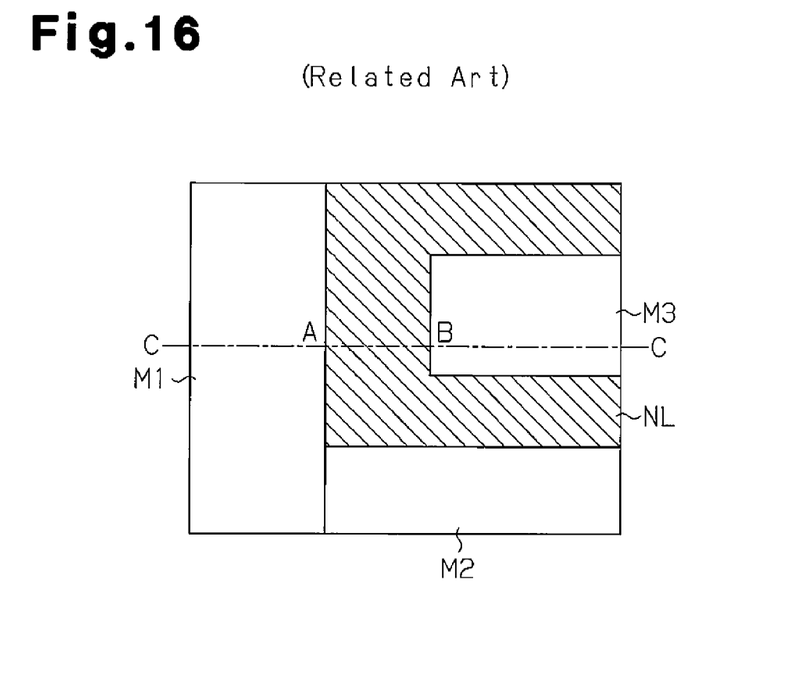
FIG. 16 is a schematic diagram of a multi-die reticle.

FIG. 16 illustrates a multi-die reticle, which includes a plurality of main chip regions M1, M2, and M3. A region outside the main chip regions M1 to M3 defines a non-layout region NL, which does not form a chip.

Each of the main chip regions M1, M2, and M3 is a region in which a pattern for exposing a main chip is formed. In each of the main chip regions M1, M2, and M3, an exposure pattern for exposing the desired device pattern on a substrate is formed. Further, an exposure pattern for exposing a large number of wiring layers is also formed.

The non-layout region NL does not include an exposure pattern for exposing a device pattern and an exposure pattern for exposing wiring layers. In a region of a substrate that corresponds to the non-layout region NL, inter-wiring insulation layers are superimposed but wiring layers are not superimposed.

Figure 15:
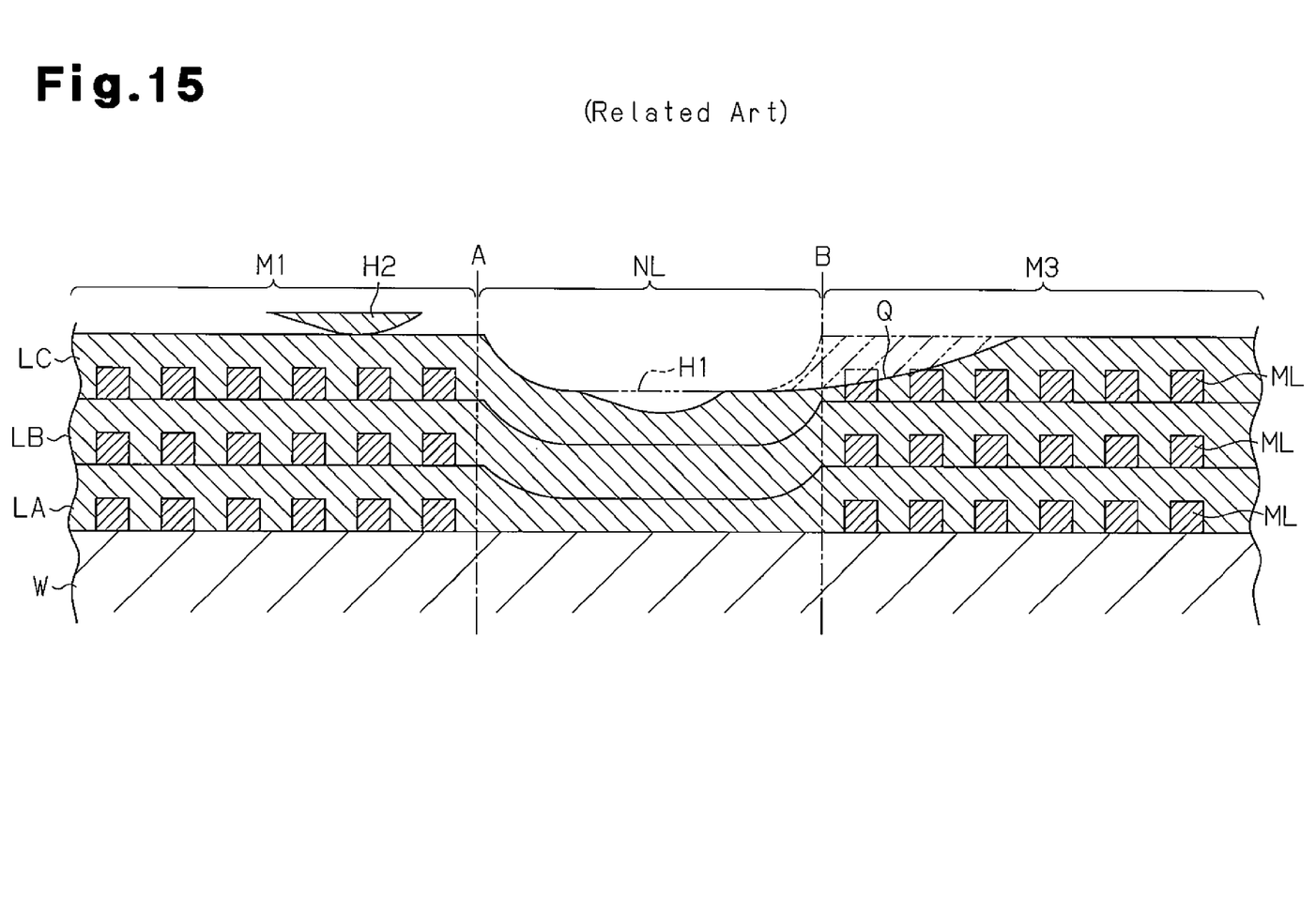
FIG. 15 is a cross-sectional view illustrating portions of the main chip region and non-layout region of the wafer substrate.

FIG. 15 illustrates the cross-section of main chip regions and a non-layout region in a wafer substrate W manufactured with the multi-die reticle of FIG. 16. Points A and B in FIG. 15 respectively correspond to points A and B through which line C-C extends in FIG. 16. In the main chip regions M1 and M3 of the wafer substrate W, a plurality of wiring layers LA, LB, and LC are formed, and metal lines ML are formed in each of the wiring layers LA to LC. In the non-layout region NL, the plurality of wiring layers LA to LC each include an inter-wiring insulation layer. That is, in the non-layout region NL of the wafer substrate W, a metal line ML is not formed in the wiring layers LA to LC.

Figure 17:
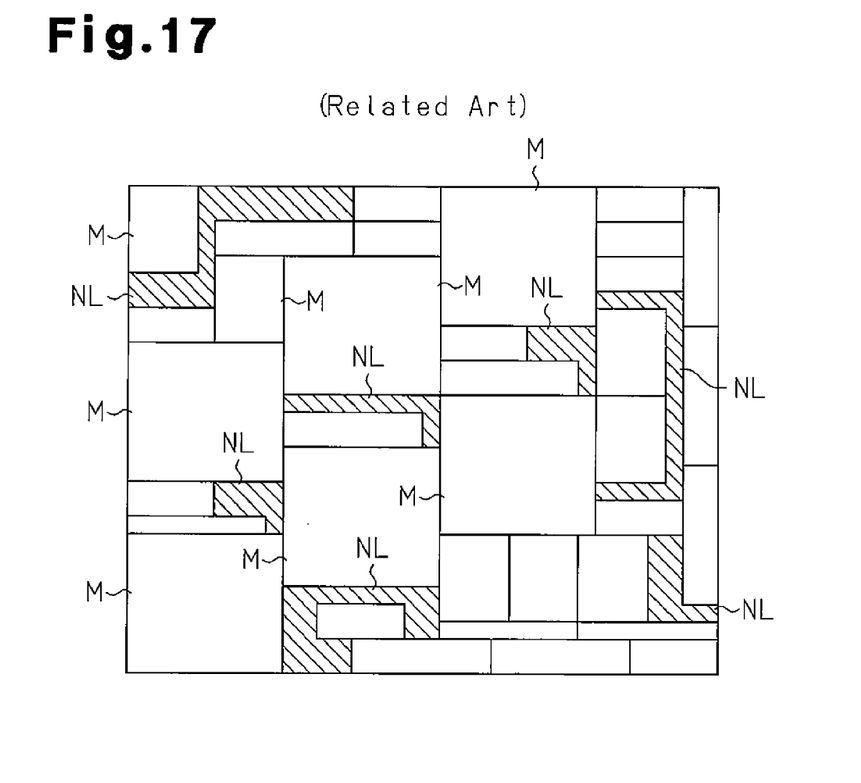
FIG. 17 illustrates a graphical image of CAD data for a multi-die reticle.

FIG. 17 illustrates a graphical image of the multi-die reticle. Main chip regions M of various types and non-layout regions NL of various shapes are scattered in the multi-die reticle. An operation of generating scribe data included in a process for generating CAD data (also referred to as reticle data) used to form the multi-die reticle is described with reference to FIG. 18.

Figure 18:
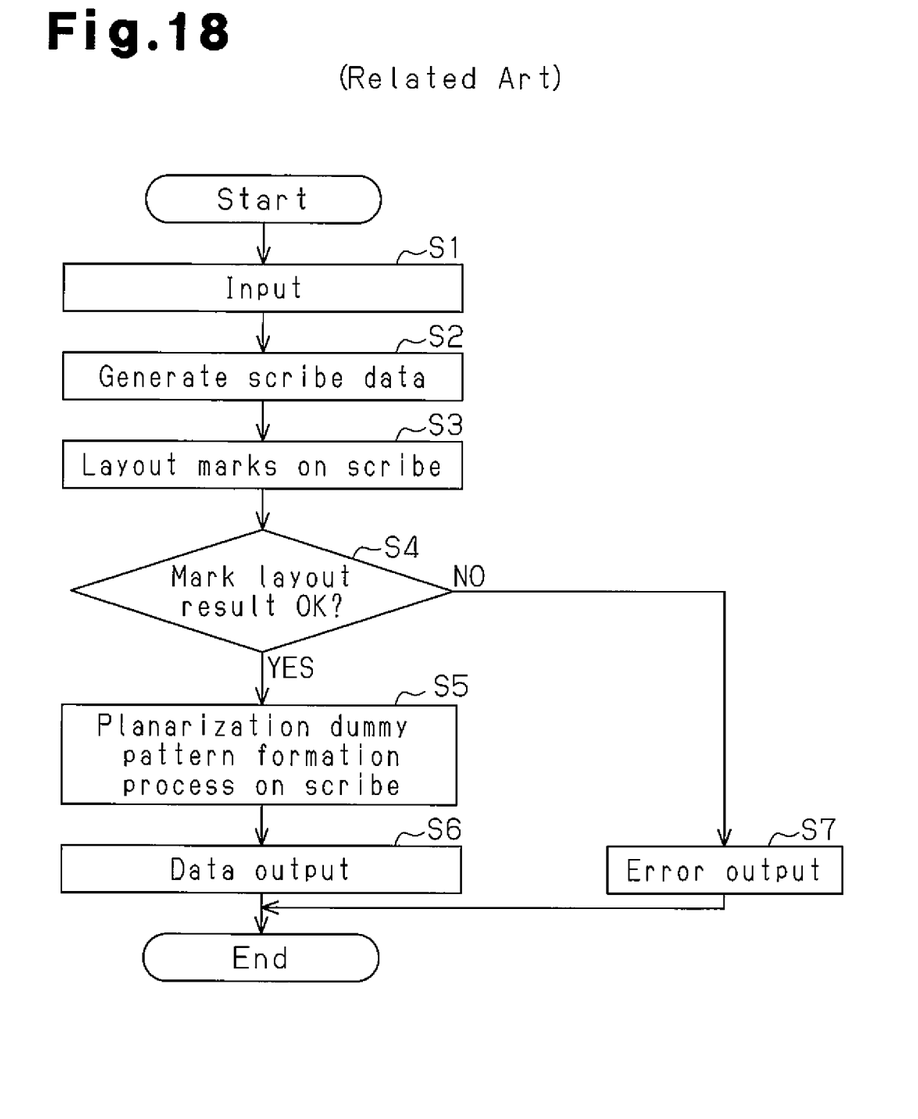
FIG. 18 is a flowchart illustrating the procedures for generating reticle data.

First, process specification data and process pattern mark data are retrieved to generate data for forming a scribe line (operations S1, S2). Marks (alignment marks, inspection marks, etc.) are laid out on the scribe line (operation S3).

When each mark is laid out on the scribe line, a dummy pattern is arranged on the scribe line so that the scribe line and the main chip region may be planarized when polished in the subsequent CMP operation (operations S4, S5). The generated CAD data is then output (operation S6), and the data generation operation is terminated.

If each mark is not laid out on the scribe line in operation S4, an error output is generated (operation S7), and the data generation operation is terminated.

Through such processing, the marks are laid out on the scribe line, and a scribe region is planarized with a main chip region.

SUMMARY

According to an aspect of the invention, a computer-implemented method for generating reticle data for forming a reticle includes, recognizing a non-layout region free from main chips in a process pattern, dividing the non-layout region into a plurality of rectangular non-layout regions, generating scribe data using the plurality of divided rectangular non-layout region as a plurality of dummy chips, and generating a dummy pattern for each of the dummy chips.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

The embodiments, together with objects and advantages thereof, may best be understood by reference to the following description of the presently embodiments together with the accompanying drawings in which.

DESCRIPTION OF EMBODIMENTS

The wafer substrate W of FIG. 15 does not include a metal line ML in the non-layout region NL. Thus, steps may form in the wafer substrate W where the main chip regions M1 and M3 are bordered with the non-layout region NL. Since wiring layers are nowadays superimposed as multi-layers, such steps tend to form a recess Q in the inter-wiring insulation layer LC of the main chip region M3. This may cause an insulation failure in the metal wiring.

Inter-wiring insulation layers are superimposed in the non-layout region NL of the wafer substrate W. Since wiring layers are nowadays superimposed as multi-layers, a physically brittle, low-permittivity substance is used to form an inter-wiring insulation layer. Due to such low-permittivity substance, dicing may result in the formation of a stripping H1 in the inter-wiring insulation layer of the non-layout region NL. Diffused material H2 formed from a stripped low-permittivity substance may lower the yield of chips.

Japanese Laid-Open Patent Publication No. 56-12644, Japanese Laid-Open Patent Publication No. 63-236045, and Japanese Laid-Open Patent Publication No. 62-54921 disclose a photomask that may be used to form patterns for two or more types of chips, which have different patterns, on the similar reticle. However, none of these publications addresses the above-mentioned problem arising from a non-layout region of a multi-die reticle nor suggests a solution for such a problem.

Japanese Laid-Open Patent Publication No. 2000-147742 discloses a method for generating CAD data used for a multi-die reticle. However, this publication discloses a process for ensuring an optimum scribe region adjacent to a device region but does not propose a solution for the above-described problem arising from a non-layout region.

An embodiment will be described below according to the drawings.

Figure 1:
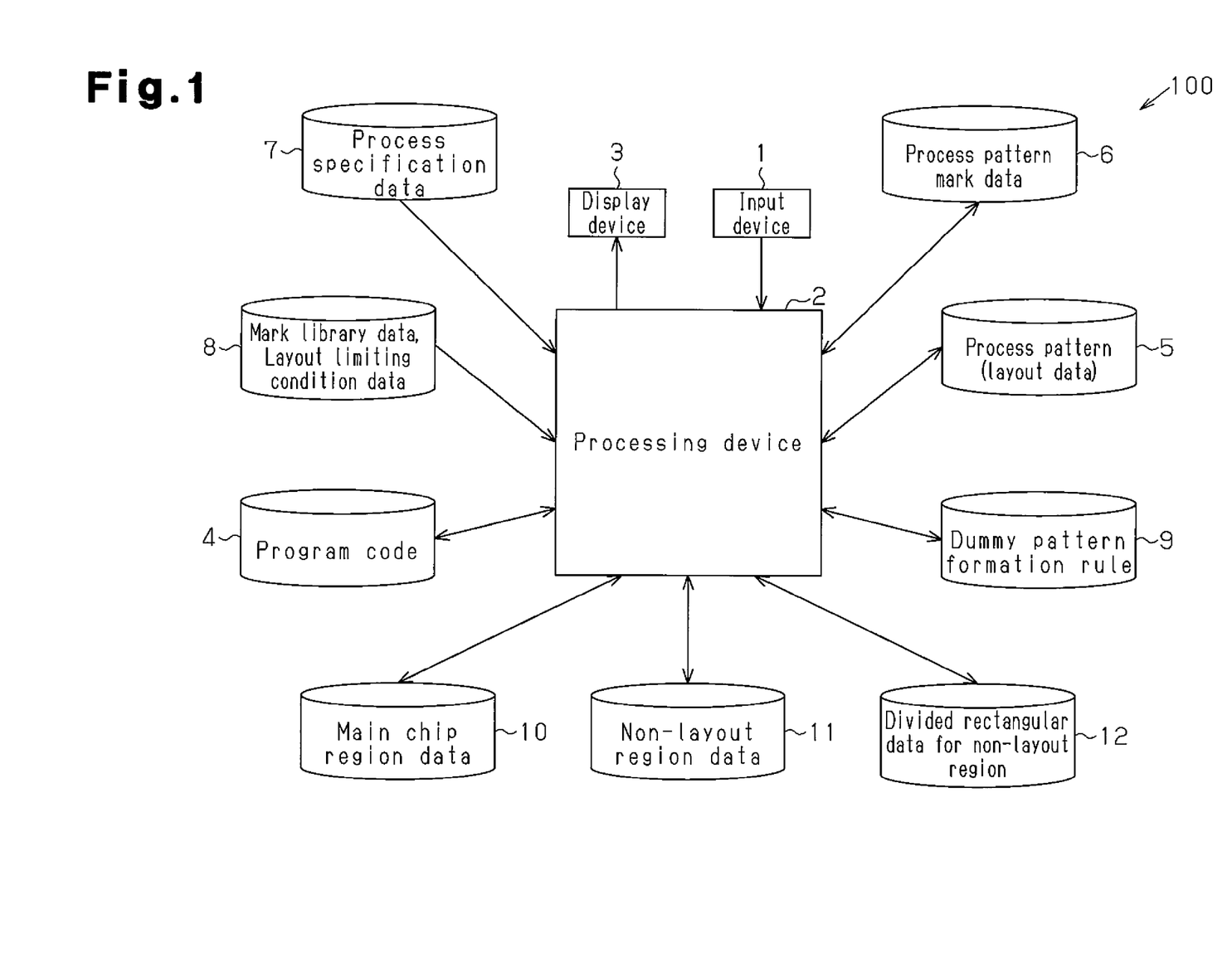
FIG. 1 is a block diagram illustrating a reticle data generation apparatus.

FIG. 1 illustrates a computer aided design (CAD) data generation apparatus 100 for a multi-die reticle. An input device 1 inputs an input signal for instructing various processing operations to a processing device 2. The processing device 2 functions as a non-layout region recognition (detection) unit, a rectangle dividing unit, a scribe data generation unit, a dummy pattern formation unit, a determination unit, and a re-layout unit. A display device 3 displays the CAD data generated by the processing device 2 in the form of graphics.

The processing device 2 is accessible to a storage unit, that is, electronic files 4 to 12. The electronic files 4 to 12 may be stored in a storage device, which may be wire-coupled or wirelessly-coupled to the processing device 2. The electronic files 4 to 12 may be stored in a computer-readable medium. The electronic file 4 stores program code to cause the processing device 2 to perform a process of generating CAD data for a multi-die reticle.

The electronic file 5 stores a process pattern (layout data) for a large number of main chips to form a multi-die reticle. The processing device 2 performs a process of retrieving process patterns from the electronic file 5 and generating CAD data.

The electronic file 6 stores process pattern mark data. The processing device 2 retrieves the process pattern mark data from the electronic file 6 and lays out an alignment mark, an inspection mark, or the like in a scribe region.

The electronic file 7 stores process specification data. The processing device 2 performs the process of generating CAD data in accordance with the process specification.

The electronic file 8 stores library data related to the marks laid out in scribe regions and layout limiting condition data used when laying out each mark. The processing device 2 performs a process of laying out the mark based on the layout limiting condition data.

The electronic file 9 stores dummy pattern formation rules. The processing device 2 forms a dummy pattern in a non-layout region or a scribe region in accordance with the dummy pattern formation rules.

The electronic file 10 temporarily stores main chip region data generated in the processing device 2. The electronic file 11 temporarily stores non-layout region data generated in the processing device 2. The electronic file 12 temporarily stores divided rectangular data for non-layout regions generated in the processing device 2.

A data generation operation for a chip non-layout region of a reticle performed by the processing device 2 of the CAD data generation apparatus 100 will now be described with reference to FIGS. 2 to 12.

Figure 2:
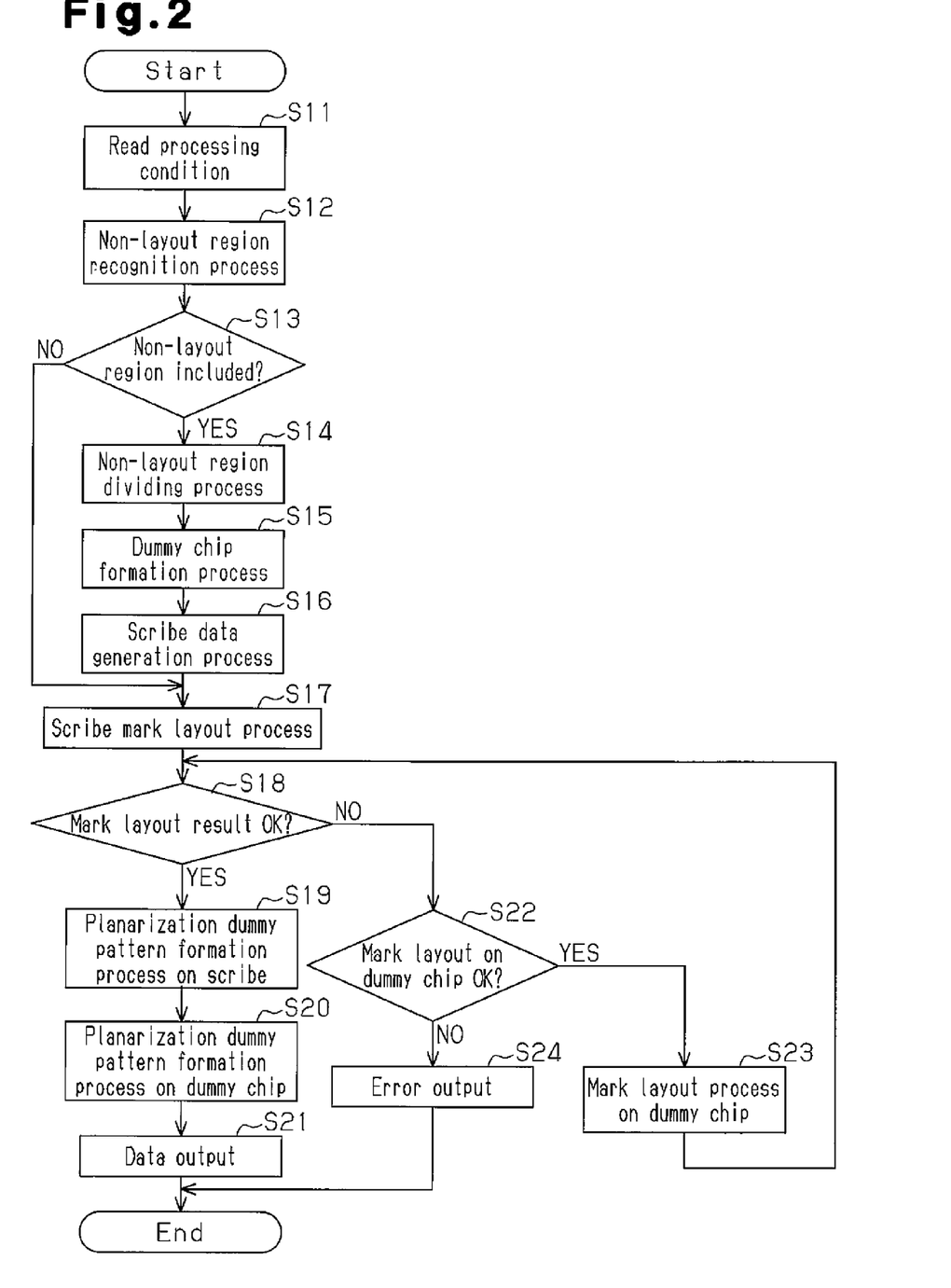
FIGS. 2 to 4 are flowcharts illustrating the operation of the reticle data generation apparatus.

Referring to FIG. 2, when the process of generating CAD data starts, the processing device 2 reads the processing condition (operation S11). Specifically, the processing device 2 retrieves the process pattern stored in the electronic file 5 and the process specification data stored in the electronic file 7.

In operation S12, the processing device 2 performs a process of recognizing (detecting) a non-layout region. This recognition (detection) process will now be described using reticle data RD for a one-shot region illustrated in FIG. 5. The reticle data RD of FIG. 5 includes main chip regions M1 to M3, which form chips, and a non-layout region NL (also referred to as chip non-layout region), which does not form a chip. The non-layout region NL is laid out between the main chip regions M1 to M3.

Figure 3:
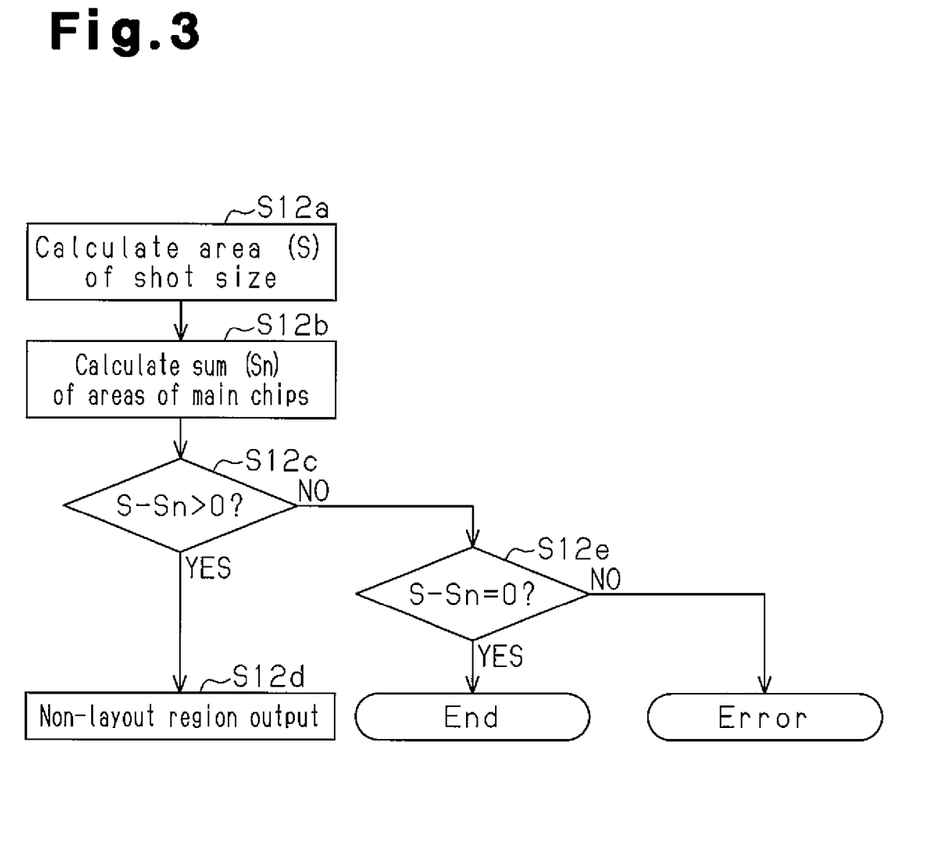
Figure 4:
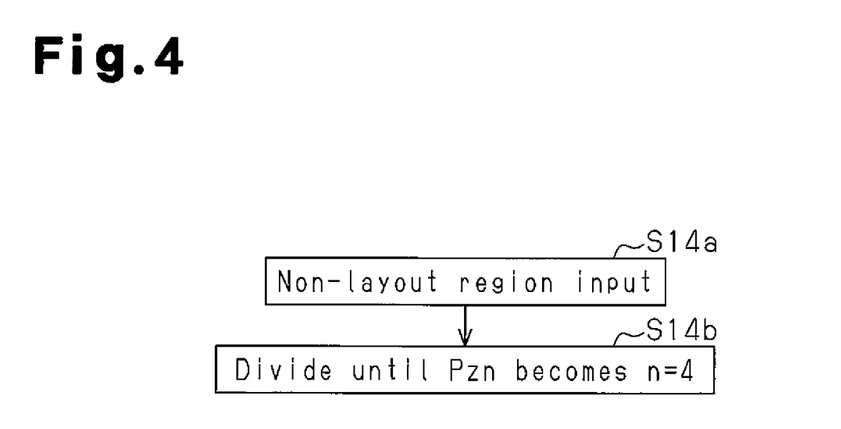
Figure 5:
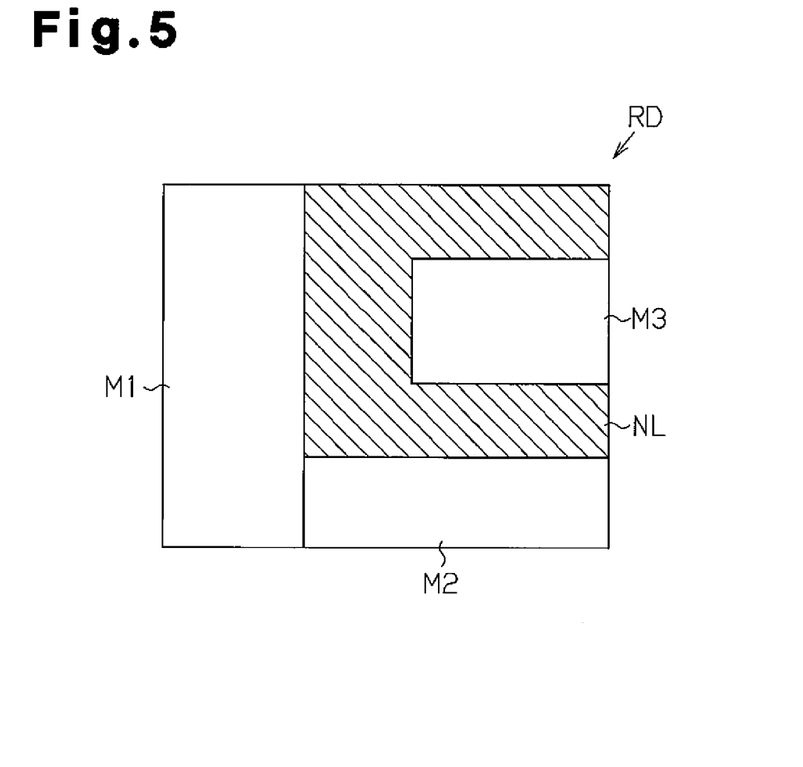
FIGS. 5 to 13 are schematic diagrams illustrating the procedures for generating reticle data.
Figure 6:
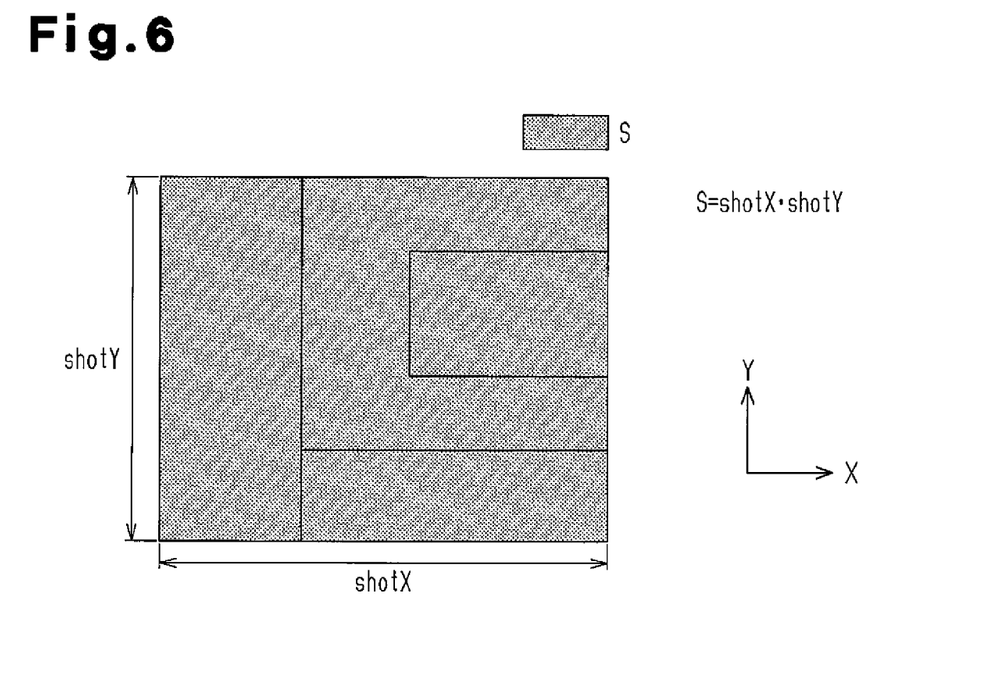

FIG. 3 illustrates the process of operation S12 in detail. In operation S12, the processing device 2 first calculates the area S of a one-shot region for the reticle data RD (operation S12a). As illustrated in FIG. 6, the area S of the reticle data is obtained by calculating the product of the multiplying an X-axis direction length shotX and a Y-axis direction length shotY.

Figure 7:
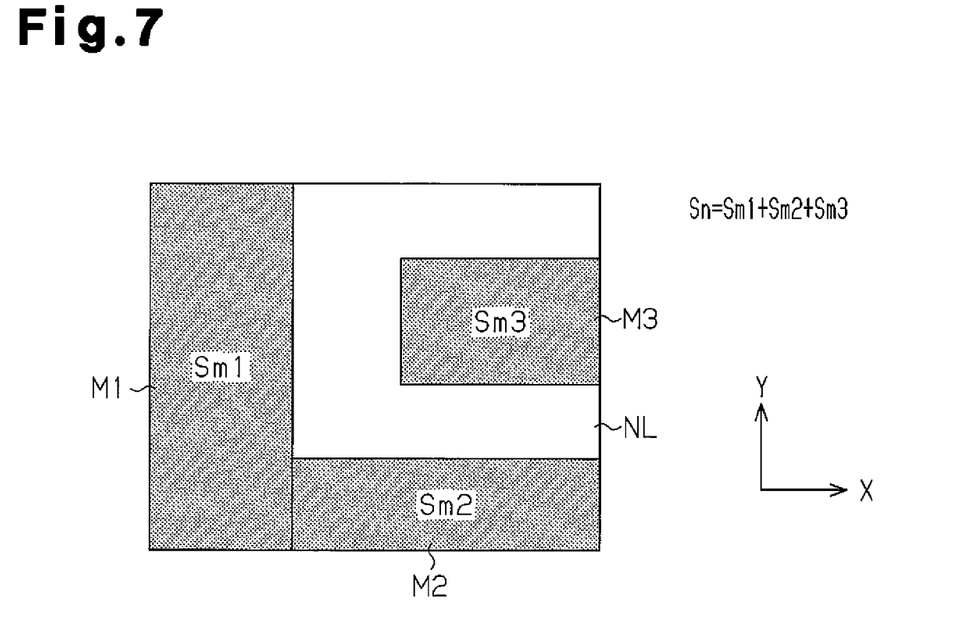
Figure 8:
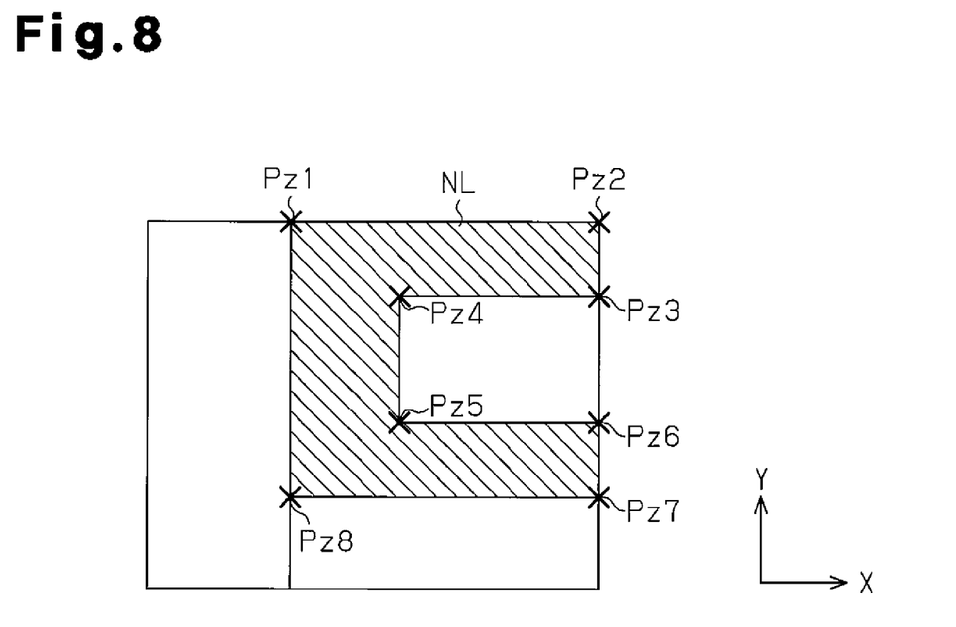

Then, referring to FIG. 7, the processing device 2 calculates the sum Sn of the areas of the main chip regions M1 to M3 (operation S12b). Each area Sm1, Sm2, and Sm3 of the main chip regions M1, M2, and M3 is obtained by calculating the product of the X-axis direction length and the Y-axis direction length of each chip region in the similar manner as when calculating the area S of the one-shot region. The sum Sn of the main chip regions is obtained by calculating Sm1+Sm2+Sm3.

The processing device 2 then subtracts the sum Sn of the areas of the main chip regions M1 to M3 from the area S of the one-shot region. Then, the processing device 2 determines whether or not the difference S−Sn is greater than zero (operation S12c). If the difference S−Sn is greater than zero (YES in operation S12c), the one-shot region includes a non-layout region NL. In such a case, the processing device 2 proceeds to operation S12d and temporarily stores a non-layout region output in the electronic file 11. In operation S12d, the processing device 2 may output the XY coordinate of each vertex (also referred to as boundary point) Pz1 to Pz8 of the non-layout region NL as an output of the non-layout region NL.

If the difference S−Sn is less than or equal to zero in operation S12c (NO in operation S12c), the processing device 2 proceeds to operation S12e to determine whether the difference S−Sn is either zero or less than zero. If the difference S−Sn is zero (YES in operation S12e), a non-layout region NL is not included. Thus, the processing device 2 proceeds to the next operation. If the difference S−Sn is less than zero (NO in operation S12e), the processing device 2 generates an error output.

When a non-layout region NL is output in operation S12, the processing device 2 proceeds from operation S13 to operation S14. If a non-layout region is not output in operation S12, the processing device 2 proceeds to operation S17.

In operation S14, the processing device 2 performs a process of dividing the non-layout region NL. Operation S14 is illustrated in detail in FIG. 4. In operation S14a, the processing device 2 retrieves the non-layout region data from the electronic file 11. In operation S14b, the processing device 2 divides the non-layout region NL into simple rectangles, each having four vertices Pz.

Figure 9:
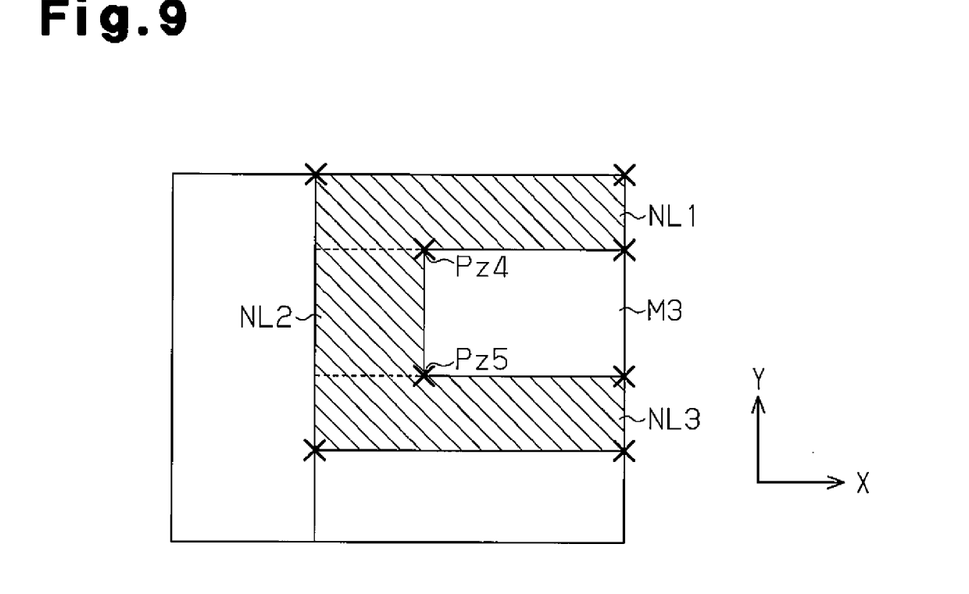
Figure 10:
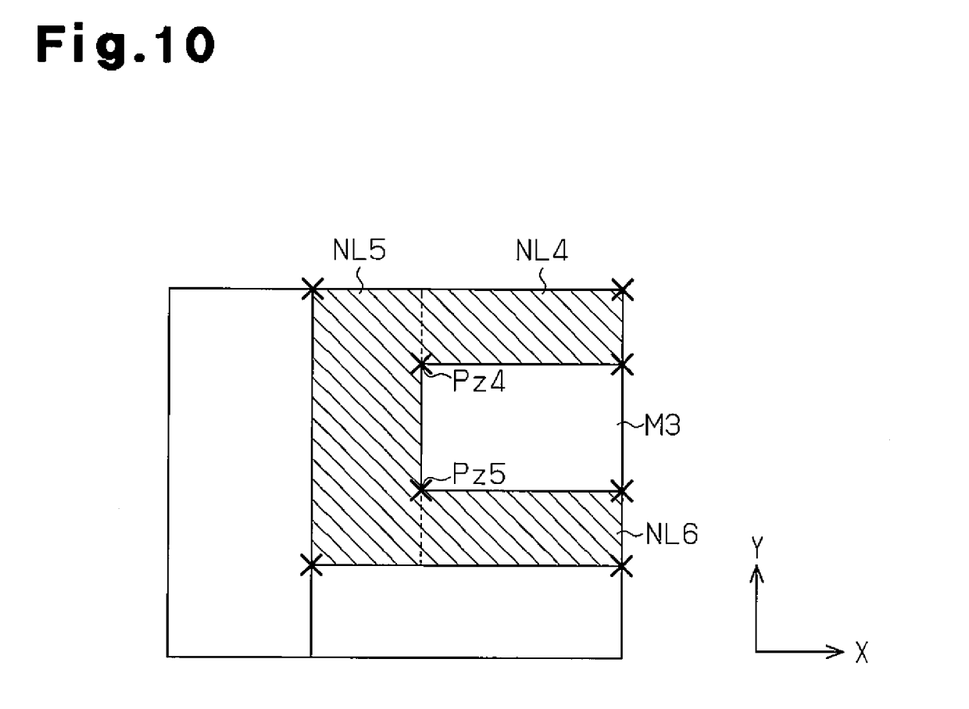

In the example of FIG. 9, the non-layout region NL is divided into rectangular non-layout regions (rectangular divided regions) NL1 to NL3 by a linear segment extending in the X-axis direction and including the vertex Pz4 and a linear segment extending in the X-axis direction and including the vertex Pz5. In the example of FIG. 10, the non-layout region NL is divided into rectangular non-layout regions (rectangular divided regions) NL4 to NL6 by a linear segment extending in the Y-axis direction and including the vertex Pz4 and a linear segment extending in the Y-axis direction and including the vertex Pz5. The non-layout region NL may be divided into a minimum number (three in the examples of FIGS. 9 and 10) of rectangular non-layout regions.

As one example of a criterion for selecting the direction for dividing the non-layout region NL, priority is given to a line segment that is continuous with a wider one of scribe regions in a main chip. For example, with reference to FIG. 8, if the widths of scribe lines Pz3-Pz4 and Pz5-Pz6 for the main chip M3 are greater than the width of scribe line Pz4-Pz5, the non-layout region NL is divided by line segments (extended lines) that are continuous with the wide scribe lines Pz3-Pz4 and Pz5-Pz6 as illustrated in FIG. 9. The number of marks laid out in the scribe region may be increased by selecting wider scribe regions.

Figure 11:
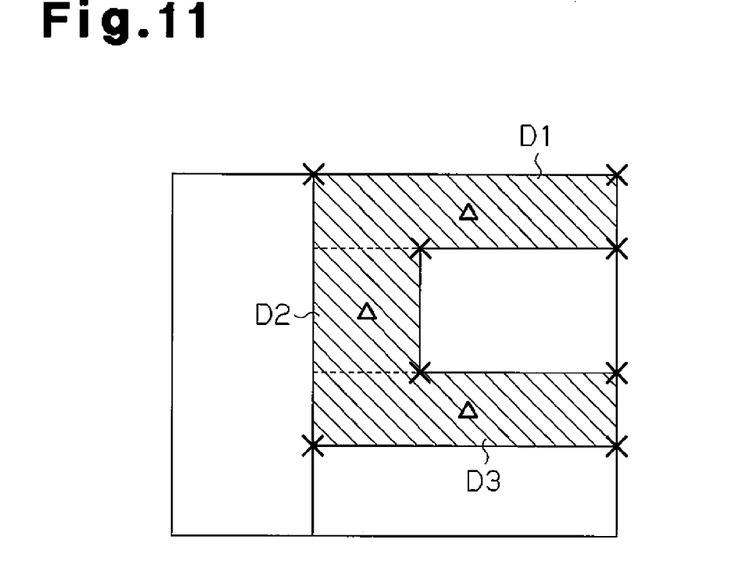
Figure 12:
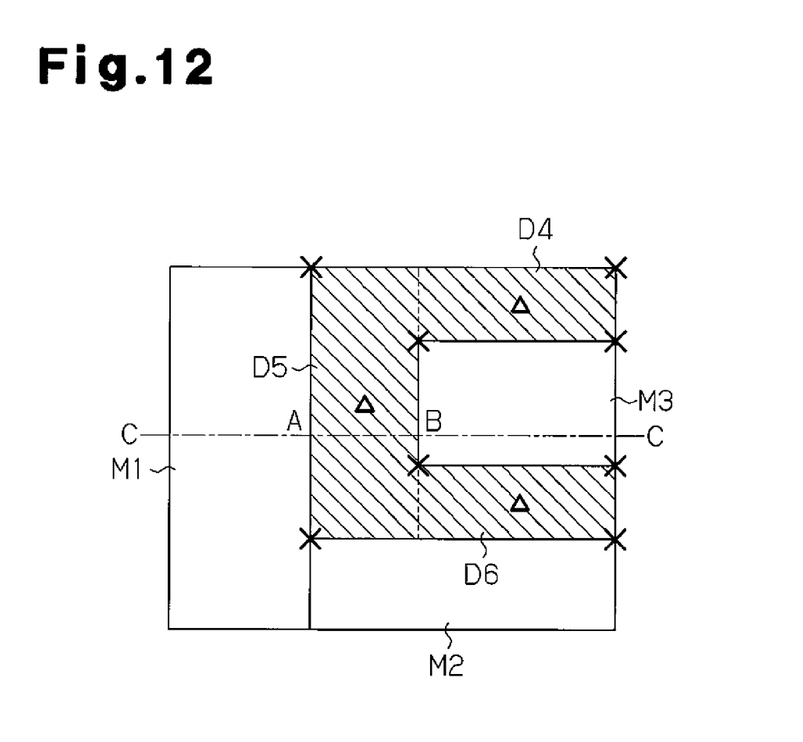

The processing device 2 then performs the process of forming dummy chips (operation S15). In FIG. 11, the divided non-layout regions NL1 to NL3 in FIG. 9 are filled with dummy chips D1 to D3. In FIG. 12, the divided non-layout regions NL4 to NL6 of FIG. 10 are filled with dummy chips D4 to D6. Each dummy chip may be used for planarization.

The processing device 2 then generates data for each scribe region between the dummy chips (operation S16). Subsequently, the processing device 2 performs a process of laying out a mark in each scribe region (operation S17).

The processing device 2 then determines whether or not the certain mark has been laid out (operation S18). If the certain mark has been laid out (YES in operation S18), the processing device 2 proceeds to operation S19 and forms (lays out) a planarization dummy pattern for each scribe region. The processing device 2 then forms a planarization dummy pattern for each dummy chip D1 to D3 (or D4 to D6) (operation S20).

The processing device 2 outputs the data of the dummy chips and the data of the scribe regions for the dummy chips that are generated as described above (operation S21). Then, the processing device 2 terminates the processing operation.

If the certain mark is not laid out in each scribe region (NO in operation S18), the processing device 2 proceeds to operation S22 and determines whether or not a mark may be laid out in the dummy chips formed in operation S15 based on the layout limiting condition data in the electronic file 8. If a mark may be laid out, the processing device 2 lays out the mark in the dummy chip region (operation S23) and returns to operation S18 to determine the mark layout result.

If determined that a mark may not be laid out in a dummy chip region in operation S22, the processing device 2 generates an error output (operation S24) and then terminates the processing operation.

Figure 13:
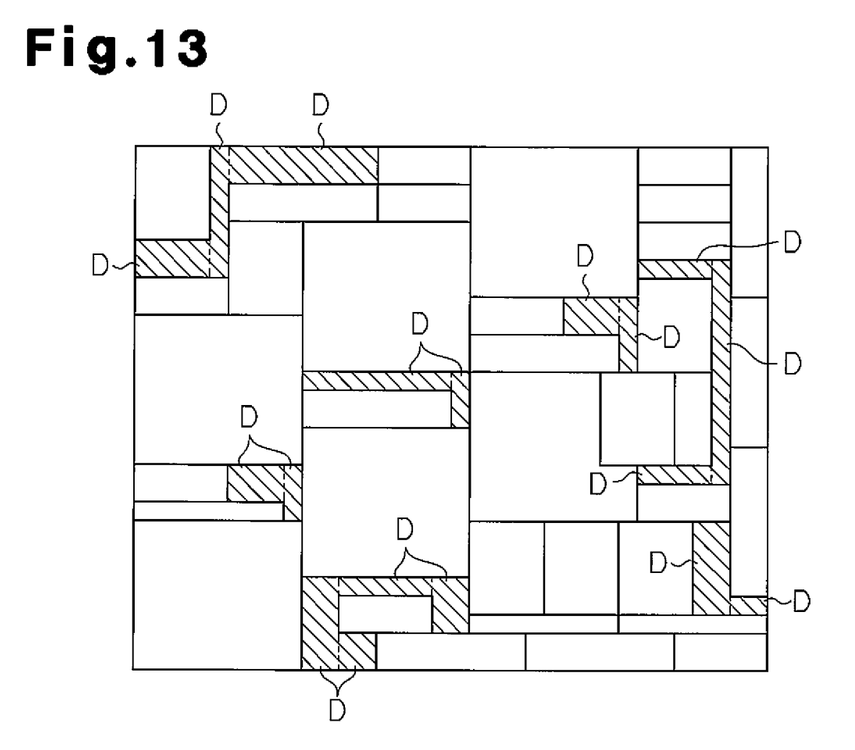

FIG. 13 illustrates CAD data including a large number of dummy chips D obtained through the above-described processing. Each non-layout region is divided into a plurality of rectangular non-layout regions. Each rectangular non-layout region is used as a dummy chip D in which a planarization dummy pattern is formed. In this matter, reticle data that may form a dummy chip in each one of the non-layout regions is generated.

The CAD data generation apparatus for a multi-die reticle and a wafer manufactured by using a reticle formed with such CAD data have the following advantages.

(1) A dummy chip region including a dummy pattern may be formed in a chip non-layout region of a multi-die reticle. Accordingly, a main chip region and a non-layout region are planarized in a wafer manufactured by using such a multi-die reticle.

Figure 14:
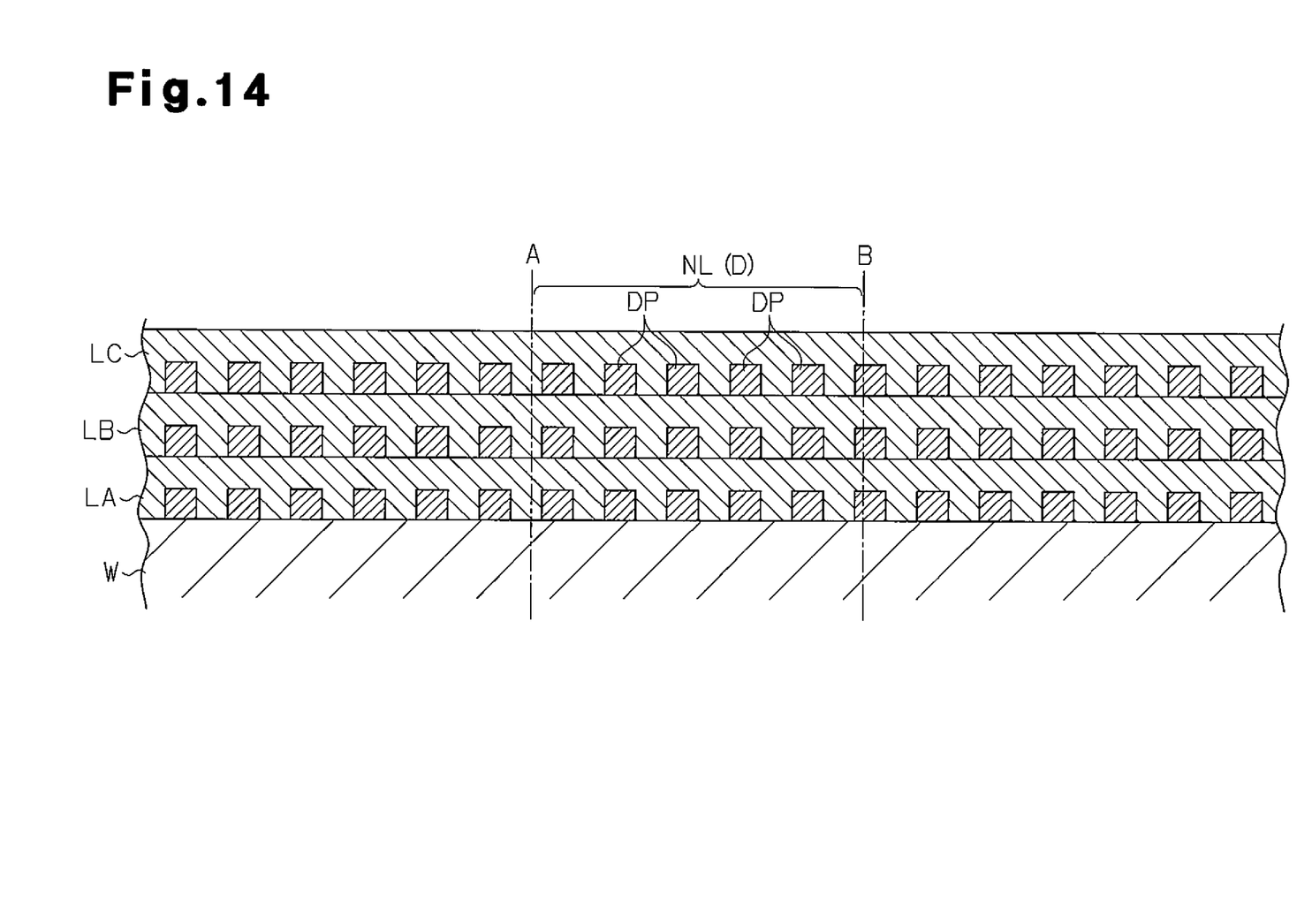
FIG. 14 is a cross-sectional view illustrating main chip regions and a non-layout region of a wafer substrate.

(2) A dummy chip D including a dummy pattern is laid out in the non-layout region. Referring to FIG. 14, a dummy pattern DP located in the non-layout region NL ensures the physical strength of the inter-wiring insulation layers LA, LB, and LC in the non-layout region NL, and the dummy pattern DP of the dummy chip D formed in the non-layout region NL of the wafer W prevents stripping of the inter-wiring insulation layer during dicing. The dummy pattern DP may be a metal line pattern.

(3) The mark for a process pattern may also be laid out in a dummy chip region. Accordingly, marks that may not be laid out in a dicing region may be arranged in a dummy chip region to increase the number of marks.

(4) A non-layout region is divided into a plurality of rectangular non-layout regions, and a scribe region is formed by using each rectangular non-layout region as a dummy chip. Thus, main chips and dummy chips may easily be removed from a wafer substrate by performing dicing along a scribe region.

The above-described method for generating data for a multi-die reticle increases the yield of chips that are manufactured with such a multi-die reticle.

The above-described embodiment may be modified as described below.

It is preferred that a dummy pattern DP formed in a dummy chip D include the similar number of wiring layers as a main chip from the viewpoint of planarization. However, the stripping of an inter-wiring insulation layer may be prevented as long as at least one layer of a dummy pattern is formed in a given number of wiring layers of the dummy chip D.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the above embodiment of the present invention has been described in detail, it should be understood that the various changes, substitutions, and alterations could be made hereto without departing from the spirit and scope of the invention.

What is claimed is:

1. A computer-implemented method for generating reticle data for forming a reticle, the method comprising:
   recognizing a non-rectangular-shaped non-layout region free from main chips in a process pattern, wherein each non-rectangular-shaped non-layout region includes an inter-wiring insulation layer but does not include a metal line;
   arranging a scribe region in the non-rectangular-shaped non-layout region to divide the non-rectangular-shaped non-layout region into a plurality of rectangular non-layout regions;
   generating a dummy pattern at a location corresponding to the scribe region between the plurality of rectangular non-layout regions, the scribe region being a linear segment that includes an end point at a certain vertex of the non-rectangular-shaped non-layout region and is orthogonal to a scribe line surrounding the non-rectangular-shaped non-layout region; and generating a dummy pattern in each of the rectangular non-layout regions to use as a dummy chip, wherein each rectangular non-layout region includes the metal line in the inter-wiring insulation layer after the dummy pattern is generated.

2. The method according to claim 1, wherein the generated dummy pattern includes at least one layer of metal wiring.

3. The method according to claim 1, wherein the generated dummy pattern and a main chip includes the similar wiring layer.

4. The method according to claim 1, wherein said generating scribe data includes:

determining whether or not marks are laid out in a scribe region in the dummy chips; and laying out the marks within a region of the dummy chip when the marks are not laid out in the scribe region.

5. The method according to claim 1, wherein said dividing the non-layout region into a plurality of rectangular non-layout regions includes:

dividing the non-layout region in the similar direction as in which extends a wide one of scribe regions, which are used for cutting out and separating the main chips.

6. A wafer exposed and processed using a reticle generated by employing the method for generating reticle data according to claim 1.

7. The method according to claim 1, wherein:

the reticle is a multi-chip reticle adapted to expose main chips having different dimensions; and the non-layout region is adjacent to and formed between the main chips having different dimensions.

8. A method for generating reticle data, the method comprising:

detecting a non-rectangular-shaped non-layout region in a process pattern, wherein each non-rectangular-shaped non-layout region includes an inter-wiring insulation layer but does not include a metal line;

arranging a linear scribe region in the non-rectangular-shaped non-layout region to divide the non-rectangular-shaped non-layout region into a plurality of rectangular non-layout regions; and arranging, by a computer, a dummy pattern in the non-rectangular-shaped non-layout region at a location corresponding to the linear scribe region between the plurality of rectangular non-layout regions to generate the reticle data, the scribe region being a linear segment that includes an end point at a certain vertex of the non-rectangular-shaped non-layout region and is orthogonal to a scribe line surrounding the non-rectangular-shaped non-layout region, wherein each rectangular non-layout region includes the metal line in the inter-wiring insulation layer after the dummy pattern is generated.

* * * * *